(12) United States Patent
Okubo et al.

(10) Patent No.: US 7,314,690 B2
(45) Date of Patent: Jan. 1, 2008

(54) PHOTOMASK PRODUCING METHOD AND PHOTOMASK BLANK

(75) Inventors: Yasushi Okubo, Tokyo (JP); Mutsumi Hara, Tokyo (JP)

(73) Assignee: Hoya Corporation, Tokyo (JP)

(*) Notice: Subject to any disclaimer, the term of this patent is extended or adjusted under 35 U.S.C. 154(b) by 406 days.

(21) Appl. No.: 10/820,785

(22) Filed: Apr. 9, 2004

(65) Prior Publication Data

US 2005/0019674 A1    Jan. 27, 2005

(30) Foreign Application Priority Data

Apr. 9, 2003    (JP)    ............... 2003/105921

(51) Int. Cl.
G03F 1/00    (2006.01)
(52) U.S. Cl. ........................................... 430/5
(58) Field of Classification Search ............ 430/5, 430/322–323, 394; 716/21
See application file for complete search history.

(56) References Cited

U.S. PATENT DOCUMENTS

| | | | |
|---|---|---|---|
| 6,472,107 B1 | 10/2002 | Chan | |
| 6,682,861 B2* | 1/2004 | Chan | 430/5 |
| 7,115,341 B2* | 10/2006 | Shiota et al. | 430/5 |
| 2004/0101764 A1* | 5/2004 | Nyhus et al. | 430/5 |

FOREIGN PATENT DOCUMENTS

| | | |
|---|---|---|
| JP | 61-138256 A | 6/1986 |
| JP | 63-39892 B2 | 8/1988 |
| JP | 7-49558 A | 2/1995 |
| JP | 8-234410 A | 9/1996 |
| JP | 10-69055 A | 3/1998 |
| JP | 2000-181049 A | 6/2000 |
| JP | 2001-183809 A | 7/2001 |

OTHER PUBLICATIONS

VLSI Synthetic Dictionary (Science Forum) (a part of p. 865).
Submicron Lithography "Synthetic Technological Material Collection" (a part of p. 353).

* cited by examiner

Primary Examiner—S. Rosasco
(74) Attorney, Agent, or Firm—Sughrue Mion, PLLC

(57) ABSTRACT

In a method of producing a photomask (10) in which a light-transmissive substrate (1) is formed thereon with a chromium pattern (21) having a global opening ratio difference in its plane on the light-transmissive substrate (1), use is made, as an etching mask for a chromium film (2), of an etching mask pattern (31) made of an inorganic-based material having a resistance against etching of the chromium film (2). Dry etching of the chromium film (2) is carried out under a condition selected from conditions that cause damage to a resist pattern (41) to a degree which is unallowable when etching the chromium film (2) using the resist pattern (41) as a mask.

21 Claims, 3 Drawing Sheets

PORTION A          PORTION B

PORTION A  PORTION B

PHOTOMASK PRODUCING METHOD AND PHOTOMASK BLANK

This application claims priority to Japanese Patent Application No. 2003-105921 Apr. 9, 2003, the disclosure of which is incorporated herein by reference.

BACKGROUND OF THE INVENTION

This invention relates to a method of producing a photomask for use in production of a semiconductor integrated circuit, a liquid crystal display device, or the like, and to a photomask blank for use therein.

Following high integration of semiconductor integrated circuits, liquid crystal display devices, etc., and so forth, there has been an increasing demand for high pattern accuracy with respect to photomasks that are used in fine processing during the production process thereof.

In the photomasks currently used, a pattern formed by an opaque film is provided on a transparent substrate, and a chromium-based material is generally used as the opaque film in terms of processability of a highly accurate pattern.

However, with respect to the demand for higher accuracy of the patterns of the photomasks following the high integration of the semiconductor integrated circuits and so forth, it has become clear that the current method of forming a pattern from a chromium-based opaque film by using a resist pattern as an etching mask raises a problem of variation in CD (critical dimension) accuracy due to the loading effect in connection with a photomask wherein pattern regions having a global opening ratio difference are compositely present in the mask plane. As the photomask wherein the pattern regions having the global opening ratio difference are compositely present in the mask plane, there is specifically cited a photomask wherein a plurality of kinds of functional devices are disposed in the mask plane. As such a photomask, there is cited, for example, a photomask having patterns with a difference in density and used in production of a system LSI wherein memories, logic circuits, and so forth are compositely mounted, or a D-RAM, a liquid crystal display device, or the like wherein memory cells or pixel regions, and peripheral circuits and so forth formed therearound are compositely mounted. In such a photomask, for example, the opening ratios of opaque patterns (the ratios of portions where no opaque films are formed) differ between a memory region and a logic circuit region. In the current state, in order to produce such a photomask, a desired resist pattern is first formed on a chromium-based opaque film, then, using this resist pattern as a mask, the chromium-based opaque film is patterned by dry etching mainly with radicals by the use of a chlorine-based and oxygen-based mixture gas or the like. For example, when resist patterns having the same dimensions are formed in respective regions having an opening ratio difference in opaque pattern so as to form chromium-based opaque film patterns of the same dimensions, respectively, there arises a problem that the respective opaque patterns formed by dry etching using the resist patterns of the same dimensions as masks exhibit different dimensions due to the difference between the opening ratios in the respective regions by the so-called loading effect to thereby cause variation in CD accuracy.

Here, the loading effect is a phenomenon that etching characteristics (etching rate, selection ratio, etc.) change depending on a magnitude of an etching area of an etching-subject film so that a CD shift in the mask plane changes (see, e.g. VSLI Synthetic Dictionary (Science Forum) pp. 865). More specifically, it is a phenomenon that when the etching area increases, the utilization efficiency of etchants decreases to reduce the etching rate (see, e.g. Submicron Lithography "Synthetic Technological Material Collection" pp. 353).

Generally, in dry etching of a thin film made of a material containing chromium, chlorine and oxygen are used as dry etching gases to etch chromium by producing chromyl chloride. There is a problem that since contribution of radicals is large in this etching reaction, the etching progress directivity is particularly difficult to control.

As a means for solving the problem about the photomask caused by the reduction in CD accuracy due to the foregoing loading effect, there is a method wherein a pattern accuracy in etching is not lowered by improving inequality of opening ratios in a pattern peripheral region and a pattern central portion (see, e.g. Japanese Patent Application Publication (JP-A) No. 2001-183809). Specifically, this method is a method of providing a peripheral opening ratio adjusting pattern in a non-irradiated region where light from a light source is not irradiated in an exposure process using a photomask.

On the other hand, there is also a method of disposing a dummy etching pattern for dry etching rate correction in a pattern exposure region or outside the pattern exposure region when producing a phase shift photomask (see, e.g. Japanese Patent Application Publication (JP-A) No. H8-234410). In this method, as the dummy etching pattern in the pattern exposure region, use is made of a pattern having a size not greater than the resolution limit by transfer.

However, in the conventional methods described in Japanese Patent Application Publication (JP-A) No. 2001-183809 and Japanese Patent Application Publication (JP-A) No. H8-234410, there is a problem that when local inequality exists in the pattern opening ratio (i.e. when pattern regions with different densities compositely exist), it is complicated to provide an adjusting pattern corresponding thereto and it is difficult to cope with high integration of semiconductor integrated circuits. Further, since it is necessary to form the pattern that is not normally required, an increase in pattern data amount used in production of a photomask can not be avoided. This becomes a large problem in producing semiconductor devices with extremely high integration in recent years.

As a literature describing another method of suppressing the loading effect, there is U.S. Pat. No. 6,472,107. This literature describes that the loading effect can be suppressed by etching an opaque film by the use of a hard mask layer made of Ti, TiW, W, $Si_3N_4$, $SiO_2$, TiN, spin-on glass, or the like. In this method, it is not necessary to form the pattern, which is not normally required, when producing the photomask like in Japanese Patent Application Publication (JP-A) No. 2001-183809 and Japanese Patent Application Publication (JP-A) No. H8-234410 as described above. Note that the method itself of etching the opaque film by the use of the hard mask layer as described in U.S. Pat. No. 6,472,107 has been proposed for a long time also as a technique of solving a problem of reduction in CD accuracy when use is made of a resist having a small dry etching resistance (see, e.g. Japanese Patent Publication (JP-B) No. S63-39892). In terms of improving the CD accuracy, as another technique of improving the CD accuracy of a chromium film pattern, Japanese Patent Application Publication (JP-A) No. H10-69055, for example, discloses that the CD accuracy is improved by reducing the thickness of a chromium film and the thickness of a resist film that requires about three times the thickness of the chromium film.

Meanwhile, there is a phase shift mask as a photomask apart from the one called a binary mask and having been used for a long time wherein the opaque film pattern is formed on the transparent substrate. The phase shift mask improves contrast of a transferred image by providing a phase shifter portion on the mask and by shifting by 180° the phase of light passing through the phase shifter portion and a portion adjacent thereto to cause mutual interference of the light at a boundary portion therebetween. As the kind of phase shift mask, there are cited, for example, a Levenson type, a halftone type, a chromeless type, and so forth. A phase shifter layer in the Levenson-type phase shift mask is formed by normally etching a glass or is comprised of a film made of a material serving to shift a phase. A phase shifter layer in the halftone-type phase shift mask is comprised of a semitransparent phase shift material layer. These phase shift masks require an opaque ring at a peripheral portion of a pattern region for preventing leakage of exposure light. A chromium-based opaque film is normally used as this opaque ring. In the production of a phase shift mask having such an opaque ring, use is normally made of a blank in which an opaque film is formed on a phase shift material layer. First, the opaque film is etched to form a desired opaque film pattern, then the phase shift material layer is etched using the opaque film pattern as an etching mask for the phase shift layer, and then the opaque film is removed while leaving at least a portion of the opaque film that will serve as the opaque ring, thereby to produce the phase shift mask. By using such a method, the phase shift material layer has achieved a higher CD accuracy as compared to etching using a resist pattern as a mask.

Meanwhile, in recent years, further integration of the semiconductor devices has been advanced, wherein the line width has also been discussed from a line width of up to 130 nm to a line width of 90 nm, 65 nm, and further 45 nm so that higher densification of patterns has also been advanced. Therefore, there is a tendency that patterns of the photomasks are also formed further finer and much stricter values are required also for the CD accuracy thereof. There is also a tendency that since diversification of the patterns has been advanced, differences in density of the patterns also increase.

As described above, the foregoing U.S. Pat. No. 6,472,107 describes that the loading effect is suppressed by using the hard mask, and Japanese Patent Publication (JP-B) No. S63-39892 describes about improving the CD accuracy by using the hard mask. However, in order to suppress the loading effect and to achieve the high CD accuracy under the circumstances where the finer formation of the patterns and the differences in density of the patterns are in progress as described above, it is insufficient to merely use the hard mask and further technological improvement is required.

On the other hand, in terms of the improvement in CD accuracy under the foregoing circumstances, in the method described in Japanese Patent Application Publication (JP-A) No. H10-69055, since the chromium-based opaque film requires a prescribed opaque property (e.g. OD (optical density) of 3.0 or more), there is a limit to reduction in thickness of the opaque film, and resultantly, there is also a limit to reduction in thickness of the resist, and therefore, there is a limit to improvement in CD accuracy.

Further, in the production of the phase shift mask, the pattern shape of the opaque film to serve as the etching mask is directly reflected on the pattern shape of the phase shift material layer, and therefore, a dimension control of the opaque film pattern performs a very important role. In particular, the phase shift mask is a mask that is effective in fine formation of a pattern in a semiconductor device as compared to the binary mask. In recent years, since further finer formation of patterns has been progressed, further stricter dimensional accuracy of phase shift material layers has been required. On the other hand, there is also a problem that, depending on the etching condition of the phase shift material layer, the surface of the chromium-based opaque film is damaged on etching of the phase shift material layer, and particles generated thereby affect the etching of the phase shift material layer and remain as a pattern defect, which thus narrows the width of selection in etching condition.

SUMMARY OF THE INVENTION

This invention has been made for solving the foregoing problems.

Specifically, a first object of this invention is to provide a method that can suppress the loading effect and achieve a high CD accuracy when forming a highly accurate pattern by dry etching, in a photomask having a global opening ratio difference (variation in CD accuracy due to the loading effect becomes a problem).

Further, a second object of this invention is to provide a method of producing a photomask, which can form a pattern having a high CD accuracy regardless of the foregoing regions (over the whole surface of the mask) having a global opening ratio difference (variation in CD accuracy due to the loading effect becomes a problem) in the mask plane, and a photomask blank for use in the method.

Moreover, a third object of this invention is to provide a method that can suppress the loading effect and achieve a high CD accuracy on etching an opaque film as an etching mask layer when producing a halftone-type phase shift mask or a chromeless-type phase shift mask comprising a phase shift layer having a global opening ratio difference (variation in CD accuracy due to the loading effect becomes a problem).

According to a first aspect of this invention, there is obtained a method of producing a photomask in which a light-transmissive substrate is formed thereon with a chromium pattern having a global opening ratio difference in its plane on the light-transmissive substrate, the method characterized by comprising the steps of preparing a photomask blank having, on the light-transmissive substrate, at least a chromium film for forming the chromium pattern, an etching mask film made of an inorganic-based material having a resistance against etching of the chromium film, and a resist film; of exposing and developing the resist film with a desired pattern to form a resist pattern; of applying dry etching to the etching mask film using the resist pattern as a mask to form an etching mask pattern; and of applying dry etching to the chromium film using the etching mask pattern as a mask to form the chromium pattern, wherein the dry etching of the chromium film is carried out under a condition selected from conditions that cause damage to the resist pattern to a degree which is unallowable when etching the chromium film using the resist pattern as a mask.

In the foregoing photomask producing method according to the first aspect of this invention, it is preferable that the condition that causes damage to the resist pattern which is unallowable when etching the chromium film using the resist pattern as a mask be a condition that increases anisotropy of dry etching and/or a condition that increases an etchant density of etching. Further, the photomask may be a binary mask having the chromium pattern on the light-transmissive substrate. It may be configured to further include a step of stripping the etching mask pattern after forming the chromium pattern. Further, the etching mask pattern may be left on the chromium pattern as a film having a reflection preventing function. The photomask may be a phase shift mask and the photomask blank may have a phase shift film between the light-transmissive substrate and the chromium film, and it may be configured to further include a step of forming the phase shift pattern using the chromium pattern as a mask after the step of forming the chromium pattern. The photomask may be a phase shift mask and it may be configured to include a step of patterning the light-transmissive substrate to form a phase shift groove using the chromium pattern as a mask after the step of forming the chromium pattern.

According to a second aspect of this invention, there is obtained a photomask producing method of producing a halftone-type phase shift mask in which a light-transmissive substrate is formed thereon with a light-semitransmissive phase shift film pattern having a global opening ratio difference in its plane on the light-transmissive substrate, the method characterized by comprising the steps of preparing a photomask blank having, on the light-transmissive substrate, at least a light-semitransmissive phase shift film for forming the light-semitransmissive phase shift film pattern, a chromium film for forming the chromium pattern, an etching mask film made of an inorganic-based material having a resistance against etching of the chromium film, and a resist film; of exposing and developing the resist film with a desired pattern to form a resist pattern; of applying dry etching to the etching mask film using the resist pattern as a mask to form an etching mask pattern; of applying dry etching to the chromium film using the etching mask pattern as a mask to form the chromium pattern; of applying dry etching to the light-semitransmissive phase shift film using the chromium pattern as a mask to form a light-semitransmissive phase shift film pattern; and of removing a desired part or the whole of the chromium film pattern.

In the foregoing photomask producing method according to the second aspect of this invention, the etching mask pattern may be stripped with the dry etching of the light-semitransmissive phase shift film. The etching mask pattern may be left on the chromium pattern as a film having a reflection preventing function. The light-semitransmissive phase shift film may include an uppermost layer made of a material containing silicon, and nitrogen and/or oxygen. The light-semitransmissive phase shift film may be a film of a monolayer structure made of a material containing metal, silicon, and nitrogen and/or oxygen.

According to a third aspect of this invention, there is obtained a photomask producing method of producing a chromeless-type phase shift mask in which a light-transmissive substrate is formed thereon with a light-transmissive phase shift pattern having a global opening ratio difference in its plane on the light-transmissive substrate, the method characterized by comprising the steps of preparing a photomask blank having, on the light-transmissive substrate, at least a chromium film for forming the chromium pattern, an etching mask film made of an inorganic-based material having a resistance against etching of the chromium film, and a resist film; of exposing and developing the resist film with a desired pattern to form a resist pattern; of applying dry etching to the etching mask film using the resist pattern as a mask to form an etching mask pattern; of applying dry etching to the chromium film using the etching mask pattern as a mask to form the chromium pattern; of applying dry etching to the light-transmissive substrate using the chromium pattern as a mask to form the light-transmissive phase shift pattern; and of removing a desired part or the whole of the chromium pattern.

In the foregoing photomask producing method according to the third aspect of this invention, the etching mask pattern may be stripped with the dry etching of the light-transmissive substrate. Further, the etching mask pattern may be left on the chromium pattern as a film having a reflection preventing function.

In the foregoing photomask producing methods according to the first to third aspects of this invention, it may be configured to include a step of stripping, before the step of forming the chromium pattern, the resist pattern remaining in the step of forming the etching mask pattern. It is preferable that the etching mask film made of the inorganic-based material be made of a material containing at least one of molybdenum, silicon, tantalum, and tungsten. It is preferable that, in the step of forming the chromium pattern, an etching rate of the chromium film be ten or more times an etching rate of the etching mask pattern.

According to a fourth aspect of this invention, there is obtained a photomask blank serving as a base member for producing a halftone-type phase shift mask in which a light-transmissive substrate is formed thereon with a light-semitransmissive phase shift film pattern having a desired opening, the photomask blank characterized in that a light-semitransmissive phase shift film, a chromium film, and an etching mask film made of an inorganic-based material having a resistance against dry etching of the chromium film are laminated in order on the light-transmissive substrate.

In the foregoing photomask blank according to the fourth aspect of this invention, the light-semitransmissive phase shift film may include an uppermost layer made of a material containing silicon, and nitrogen and/or oxygen. The light-semitransmissive phase shift film may be a film of a monolayer structure made of a material containing metal, silicon, and nitrogen and/or oxygen. The etching mask film may be made of a material that is possible to strip with the dry etching of the light-semitransmissive phase shift film. The etching mask film may be a film having a reflection preventing function.

In this invention, as the etching mask for the chromium film, use is made of the etching mask pattern made of the inorganic-based material having a resistance against the etching of the chromium film.

Dry etching is normally carried out by producing ions and radicals and reacting these etchants with an etching object. Generally, it is considered that, in dry etching of a chromium film using a mixture gas of chlorine-based gas (e.g. $Cl_2$) and oxygen-based gas (e.g. $O_2$) as a dry etching gas, the reaction occurs mainly with the action of radicals. The dry etching mainly with radicals is defined as a method of controllably producing more radicals than ions as etchants and of reacting them with an etching object. In dry etching of a chromium film, it is considered that when producing a mask having a global opening ratio difference in the mask plane, the loading effect is generated due to an etching area difference of the chromium film and a coating ratio difference of a resist pattern, caused by consumption of oxygen radicals due to isotropic etching of a resist caused by isotropic etching components being radicals, oxygen radicals, etc., and so forth. On the other hand, when etching of a chromium film is carried out using as a mask an etching mask pattern made of an inorganic-based material, if use is made as the etching mask pattern of a pattern with less influence of the loading effect and less variation in CD accuracy as compared to a chromium film pattern formed by dry etching under the optimum condition, a chromium film pattern transferred with such a pattern shape can be one with less influence of the loading effect and less variation in CD accuracy as compared to the conventional one. In order to obtain such an etching mask pattern, there are cited, for example, the following three methods.

As the first method, there is cited a method where, in selection of a material of an inorganic-based etching mask pattern (inorganic-based etching mask layer) and a kind and a condition of a dry etching gas, such a combination is selected that enables dry etching where the reaction occurs mainly with the action of ions. The dry etching mainly with ions is defined as a method of controllably producing more ions than radicals as etchants and of reacting them with an etching object. In the dry etching mainly with ions, anisotropic etching tends to be carried out as compared to the dry etching mainly with radicals, and therefore, it is possible to reduce a CD shift of a pattern in the etching. Further, the dry etching mainly with ions is etching where anisotropic etching components are major and a pattern with an excellent sectional shape tends to be formed. As a gas to be used in such dry etching mainly with ions, use can be made of, for example, a fluorine-based gas such as $SF_6$, $CF_4$, $C_2F_6$, or $CHF_3$, or a mixture gas thereof with He, $H_2$, $N_2$, Ar, $C_2H_4$, or $O_2$, or a chlorine-based gas such as $Cl_2$ or $CH_2Cl_2$, or a mixture gas thereof with He, $H_2$, $N_2$, Ar, or $C_2H_4$.

As the second method, there is cited a method where, in selection of a material of an inorganic-based etching mask pattern (inorganic-based etching mask film) and a kind and a condition of a dry etching gas, the etching selection ratio relative to the resist film (etching rate of inorganic-based etching mask pattern material/etching rate of resist) is set greater than the etching selection ratio between a chromium film pattern (chromium film) and the resist film under the optimum etching condition of the chromium film. By increasing the foregoing selection ratio, it becomes possible to reduce a CD shift of the pattern in the etching. In this case, it is preferable that (etching rate of inorganic-based etching mask pattern material/etching rate of resist) be two or more.

As the third method, there is cited a method where the thickness of an etching mask pattern is set smaller than the thickness of a chromium film. Since the chromium film is basically etched using an etching mask pattern as a mask, it is not necessary to take into account the thickness of a resist pattern necessary for etching the chromium film. As a result, by forming the etching mask pattern as a thinner film, it becomes possible to reduce the thickness of the resist necessary for etching thereof so that the etching mask pattern with high resolution can be obtained. That is, when the resist pattern is thin, the resist pattern having a more excellent pattern sectional shape can be formed so that the CD accuracy of the etching mask pattern formed by the use of such a resist pattern is also improved. Further, as described above, dry etching for the chromium pattern can basically be carried out using only the etching mask pattern, and therefore, etching of the chromium film can be carried out in the presence of a small amount of the resist, i.e. only the residual pattern of the thin resist, or in the state of no resist by performing a resist stripping process. Accordingly, it is possible to further reduce the loading effect that is considered to be caused by consumption of oxygen radicals by the resist pattern. In this case, the thickness of the etching mask layer is preferably set to 5 to 30 nm.

Note that the foregoing first to third methods may be adopted one by one or in combination thereof simultaneously.

As described above, in this invention, dry etching is applied to the chromium film using as a mask the etching mask pattern having a pattern with less influence of the loading effect and excellent in CD accuracy variation. Therefore, as compared to the conventional technique using as a mask the resist pattern of which the pattern shape is deteriorated during dry etching of the chromium film, the pattern accuracy (CD accuracy and its variation) of the chromium pattern is significantly improved.

Further, in this invention, dry etching of the chromium film is carried out under a condition selected from conditions that cause damage to the resist pattern to a degree which is unallowable when etching the chromium film using the resist pattern as a mask. As the condition that causes large damage to the resist pattern, there is cited a condition where etching anisotropy is high. As described above, although etching of the chromium film is etching mainly with radicals considered to be isotropic etching components, it is possible to increase ionicity by controlling the dry etching condition, and to resultantly increase the anisotropy. Since increasing the anisotropy is the condition that facilitates giving damage to the resist pattern, it can not be employed in the conventional etching of the chromium film using the resist pattern as a mask. However, in this invention, since the etching mask pattern serves as a mask, it is not necessary to take into account damage to the resist pattern so that such a condition can be adopted. Even when increasing the anisotropy not only causes an increase in perpendicularity of the pattern sectional shape, but also causes occurrence of variation in etching rate in the mask plane due to some loading effect, since side etching of the pattern is reluctant to progress, variation in CD shift in the plane is reduced. Further, since the side etching amount of the pattern is small also relative to over etching that is carried out for making perpendicular the sectional shape of the chromium film pattern, the CD shift of the pattern due to the over etching can be much more controlled as compared to the conventional technique.

Furthermore, as the condition that causes large damage to the resist pattern, there is cited a condition that increases the density of etchants. As a method of decreasing the loading effect, there is considered a method of keeping constant the utilization efficiency of the etchants in the plane by adopting a dry etching condition that increases the density of the etchants. However, since this condition also facilitates giving damage to the resist pattern, it can not be employed in the conventional etching of the chromium film using the resist pattern as a mask. Particularly, such a dry etching condition that increases the density of the etchants under the condition where the anisotropy is increased is never employed because damage to the resist pattern is remarkably caused. In this invention, since the etching mask pattern serves as a mask, it is not necessary to take into account damage to the resist pattern so that such a condition can be employed.

As described above, in this invention, it is made possible to adopt the dry etching condition of the chromium film that suppresses the loading effect to improve the CD accuracy, which can not be adopted conventionally. Consequently, it becomes possible to broaden the width of controllability of the dry etching condition of the chromium film.

Note that, in the dry etching of the chromium film, the condition of high anisotropy can be achieved by using the condition that increases the ionicity in the dry etching mainly with radicals. The condition that increases the ionicity is preferably the condition where the ionicity is increased to a level where ions and radicals are approximately equal to each other.

In the dry etching in this invention, as a control method of the etchants when implementing the dry etching mainly with radicals where the ionicity is increased, there is cited a method of controlling various dry etching conditions (e.g. pressure in a chamber, gas flow rate, and RF power). That is, the dry etching mainly with ions or radicals is not determined based on a kind of gas, but, even when the same kind of gas is used, it is possible to carry out both the dry etching mainly with ions and the dry etching mainly with radicals by controlling the dry etching conditions. Further, as a method of increasing the density of the etchants, there can also be cited the method of controlling various dry etching conditions (e.g. pressure in a chamber, gas flow rate, and RF power).

In this invention, the thickness of the resist film depends on a relationship with the foregoing inorganic-based etching mask layer in the dry etching, and compositions and thicknesses of the foregoing inorganic-based etching mask layer and the foregoing opaque film may be taken into account. The resist film requires a thickness such that the resist film remains at least until completion of etching (including over etching) of the inorganic-based etching mask layer or thereafter. The thickness of the resist film may be set such that the resist film remains until completion of etching (including over etching) of the opaque film. Specifically, it is preferably 50 nm to 500 nm.

The resist pattern may be removed before forming the chromium film pattern. In this case, the chromium film pattern is formed using only the inorganic-based etching mask pattern as a mask.

In the dry etching mainly with radicals, the etching selection ratio of the chromium film relative to the inorganic-based etching mask pattern material is preferably ten or more times (the etching rate of the opaque film is ten or more times the etching rate of the inorganic-based etching mask pattern material). The thickness of the inorganic-based etching mask pattern depends on the thickness of the chromium film in terms of a relationship with dry etching of the chromium film, and the inorganic-based etching mask pattern requires a thickness such that the inorganic-based etching mask pattern remains until completion of etching (including over etching) of the chromium film or thereafter. Specifically, it is preferably 5 nm to 100 nm and, when reduction in thickness of the etching mask is taken into account, it is preferably set to 5 to 30 nm.

The inorganic-based etching mask pattern may be removed by a method such as dry etching or wet etching after forming the chromium film pattern. On the other hand, when the inorganic-based etching mask layer is formed with a composition and a thickness that exhibit the reflection preventing effect, it is possible to use the inorganic-based etching mask pattern as a reflection preventing film without removing it. With this configuration, influence of multiple reflection in a projection system caused upon exposure can be effectively suppressed.

On the other hand, a reflection preventing film may be formed between the light-transmissive substrate and the opaque film. With this configuration, influence of multiple reflection in an illumination system caused upon exposure can be effectively suppressed. In this case, it is preferable in that the process of removing the inorganic-based etching mask pattern becomes unnecessary.

In this invention, the opaque film is configured to have a composition and a thickness so as to exhibit a prescribed opaque effect against exposure light, for example, exposure light obtained by a KrF excimer laser, an ArF excimer laser, or an $F_2$ excimer laser. Herein, the wavelength of the KrF excimer laser is about 248 nm, the wavelength of the ArF excimer laser is about 193 nm, and the wavelength of the $F_2$ excimer laser is about 157 nm.

In this invention, the opaque film may be either a film of a uniform composition or a graded composition film with successive composition modulation in a direction of the thickness.

The chromium film represents a film mainly made of chromium. The chromium film is not limited to a film of Cr alone, but includes a single layer, a plurality of layers, a graded composition film, or the like of CrO (representing inclusion of chromium and oxygen, and not specifying the contents thereof, which shall apply hereinafter), CrN, CrC, CrCO, CrCN, CrON, CrCON, or the like.

As a dry etching gas used in etching the chromium film, a halogen-containing gas and an oxygen-containing gas are normally used. As the halogen-containing gas, $Cl_2$ is the most popular and there are cited $SiCl_4$, HCl, $CCl_4$, $CHCl_3$, and so forth. Besides, use can be made of a gas containing bromine or iodine. On the other hand, as the oxygen-containing gas, $O_2$ is the most popular, but $CO_2$, CO, or the like may also be used.

In the photomask producing methods having the foregoing respective configurations, forming methods of various kinds of films are not limited. The films can be formed by the use of sputtering apparatuses of an in-line type, a single-wafer type, a batch type, and so forth. It is, of course, possible to form all the films on the light-transmissive substrate by the use of the same apparatus or a combination of a plurality of apparatuses.

Further, there is provided a method of producing a photomask wherein the inorganic-based etching mask pattern (inorganic-based etching mask layer) is made of a material containing at least one of molybdenum, silicon, tantalum, and tungsten.

As a material of the inorganic-based etching mask pattern, there is cited, for example, Mo alone, MoSi, MoSiO, MoSiN, MoSiON, Si alone, SiO, SiN, SiON, Ta alone, TaB, W, WSi, TaSi, or amorphous carbon.

This invention is not limited to the method of producing the binary mask in which the opaque chromium pattern is formed on the light-transmissive substrate, but is also applicable to the method of producing the phase shift mask having the phase shift pattern formed by etching using the chromium pattern as a mask.

As the phase shift mask, there is a halftone-type phase shift mask in which the phase shift layer is light-semitransmissive. As the halftone-type phase shift mask, there is cited a monolayer type or a multilayer type.

In the monolayer-type halftone phase shift mask, a semitransparent phase shift pattern is formed on a light-transmissive substrate. An inorganic-based etching mask pattern can be used for forming a chromium film pattern that is used as a mask when forming the semitransparent phase shift pattern.

(Mode A)

On the other hand, in the multilayer-type halftone phase shift mask producing method, a two-layer type phase shift mask, for example, can be produced by configuring the inorganic-based etching mask pattern to have a composition and a thickness that exhibit a phase shift effect and by configuring the chromium film pattern to have a composition and a thickness that exhibit a light-semitransmitting effect.

(Mode B)

As another example of the two-layer type halftone phase shift mask, there is one in which a transparent substrate is formed thereon with a semitransparent phase shift pattern comprised of a phase shift layer and a thin chromium film. In the case of this example, an inorganic-based etching mask pattern can be used when forming a thin chromium film that is used in forming a pattern of the lower-layer phase shift film. In this case, it is possible to select the inorganic-based etching mask pattern so as to have an opaque function and to partly remove the inorganic-based etching mask pattern so that it remains at portions where the opaque function is required.

(Mode C)

In the multilayer-type halftone phase shift mask, the semitransparent phase shift pattern is of a multilayer structure and has a desired transmittance and phase difference through the whole multilayer structure. As an example of the two-layer type, there is one in which a light-transmissive substrate is formed thereon with a semitransparent phase shift pattern comprised of a transmittance adjusting layer and a phase shift layer. In the case of this example, an inorganic-based etching mask pattern can be used when forming a chromium pattern that is used in forming a pattern of the uppermost-layer phase shift layer.

(Mode D)

Further, in this invention, it is also possible to produce a phase shift mask of a so-called substrate etching type.

For example, it is possible to produce a so-called etching-type phase shift mask by configuring the chromium film pattern so as to have a composition and a thickness that exhibit a light-semitransmitting effect and by etching part or the whole of the appearing light-transmissive substrate so as to have a prescribed phase difference relative to transmitted light through the chromium pattern.

(Mode E)

Further, as another example of the so-called substrate etching type phase shift mask, there is a so-called etching-type phase shift mask (Levenson mask) in which a chromium film pattern in a line and space fashion appears on the surface and one side of an adjacent light-transmissive substrate is etched so as to have a prescribed phase difference relative to the other side thereof. An inorganic-based etching mask pattern can be used when forming a chromium pattern that is used as a mask when etching the substrate.

(Mode F).

Further, as another example of the phase shift mask, there is, for example, a mask in which an opening pattern and an auxiliary pattern therearound are formed on a transparent substrate by the use of a light-semitransmissive chromium film pattern having a phase difference of approximately zero, and the auxiliary pattern is etched on the substrate so as to have a phase difference of approximately 180° relative to the opening pattern. In this mask, an inorganic-based etching mask pattern can be used for forming the chromium pattern that is used as a mask in etching the substrate. In this case, it is possible to select the inorganic-based etching mask pattern so as to have an opaque function and to partly remove the inorganic-based etching mask pattern so that it remains at portions where the opaque function is required.

(Mode G)

Further, as another example of the phase shift mask, there is, for example, a mask in which an opening pattern and an auxiliary pattern therearound are formed on a transparent substrate by the use of a light-semitransmissive phase shift film having a phase difference of approximately 180°, and the opening pattern is etched on the substrate so as to have a phase difference of approximately 180° relative to the auxiliary pattern. In this mask, an inorganic-based etching mask pattern can be used for forming a chromium pattern that is used as a mask in etching the light-semitransmissive phase shift film and/or the substrate.

(Mode H)

Further, as another example of the phase shift mask, there is, for example, a so-called chromeless-type phase shift mask in which a light-transmissive substrate is etched into a prescribed pattern shape so as to have a prescribed phase difference. An inorganic-based etching mask pattern can be used for forming a pattern of a chromium film that is used as a mask when etching the substrate.

(Mode I)

Note that the inorganic-based etching mask pattern may be left as a reflection preventing film in the foregoing Modes A, D, E, F, H, and I.

Particularly, in the halftone-type phase shift mask and the chromeless-type phase shift mask, the use of the inorganic-based etching mask achieves reduction in loading effect, and further, the inorganic-based etching mask functions as a protective layer for the chromium film when etching the phase shift layer or the substrate. Therefore, damage to the surface of the chromium film is decreased so that it is possible to remarkably diminish the problem that particles generated thereby are transferred due to etching of the phase shift material layer and remain as a pattern defect.

DESCRIPTION OF THE PREFERRED EMBODIMENT

Embodiments of this invention will be described with reference to the drawings. This invention, however, is not limited to these embodiments.

First Embodiment

Figure 1:
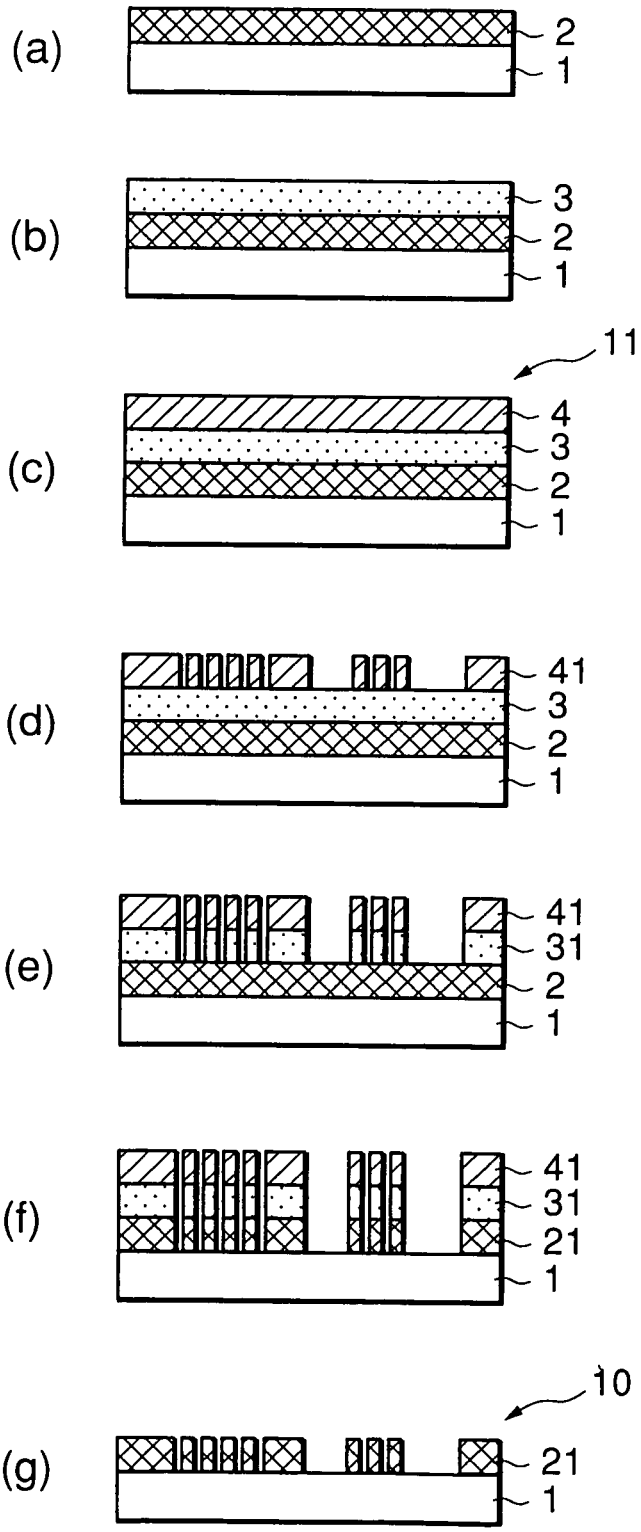
FIG. 1 is a diagram for describing photomask producing methods according to first and second embodiments of this invention.

Referring to FIG. 1, description will be made of a photomask producing method according to the first embodiment of this invention.

First, a substrate made of quartz was mirror-polished and was subjected to prescribed washing to thereby obtain a light-transmissive substrate 1 of 6 inches×6 inches×0.25 inches.

Then, by the use of an in-line sputtering apparatus where a plurality of chromium (Cr) targets were disposed in the same chamber, an opaque chromium film 2 was formed on the light-transmissive substrate 1 (see FIG. 1(a)).

Specifically, first, reactive sputtering was carried out in an atmosphere of mixture gas of argon (Ar) and nitrogen ($N_2$) (Ar:$N_2$=72:28 [volume %], pressure 0.3 [Pa]) to thereby form a CrN film having a thickness of 20 [nm].

Subsequently, reactive sputtering was carried out in an atmosphere of mixture gas of argon (Ar) and methane ($CH_4$)

(Ar:CH$_4$=96.5:3.5 [volume %], pressure 0.3 [Pa]) to thereby form a CrC film having a thickness of 37 [nm] on the Cr film.

Subsequently, reactive sputtering was carried out in an atmosphere of mixture gas of argon (Ar) and nitrogen monoxide (NO) (Ar:NO=87.5:12.5 [volume %], pressure 0.3 [Pa]) to thereby form a CrON film having a thickness of 15 [nm] on the CrN film.

The foregoing CrN film, CrC film, and CrON film were successively formed by the use of the in-line sputtering apparatus so that the opaque chromium film 2 containing these CrN, CrC, and CrON was configured such that these components continuously changed in a thickness direction thereof.

Then, by the use of a mixture target of molybdenum (Mo) and silicon (Si) (Mo:Si=20:80 [mol %]), reactive sputtering was carried out in an atmosphere of mixture gas of argon (Ar) and nitrogen (N$_2$) (Ar:N$_2$=10:90 [volume %], pressure 0.3 [Pa]) to thereby form an MoSiN-based inorganic-based etching mask film 3 having a thickness of 92 [nm] on the opaque chromium film 2 (see FIG. 1(b)).

Then, a positive electron beam resist 4 (ZEP7000: produced by Zeon Corporation) was applied on the inorganic-based etching mask film 3 to have a thickness of 400 [nm] by the spin coat method (see FIG. 1(c)).

By the foregoing, preparation was made of a photomask blank 11 in which the opaque chromium film 2, the MoSiN-based inorganic-based etching mask film 3, and the resist 4 were formed in order on the light-transmissive substrate 1.

Figure 2:
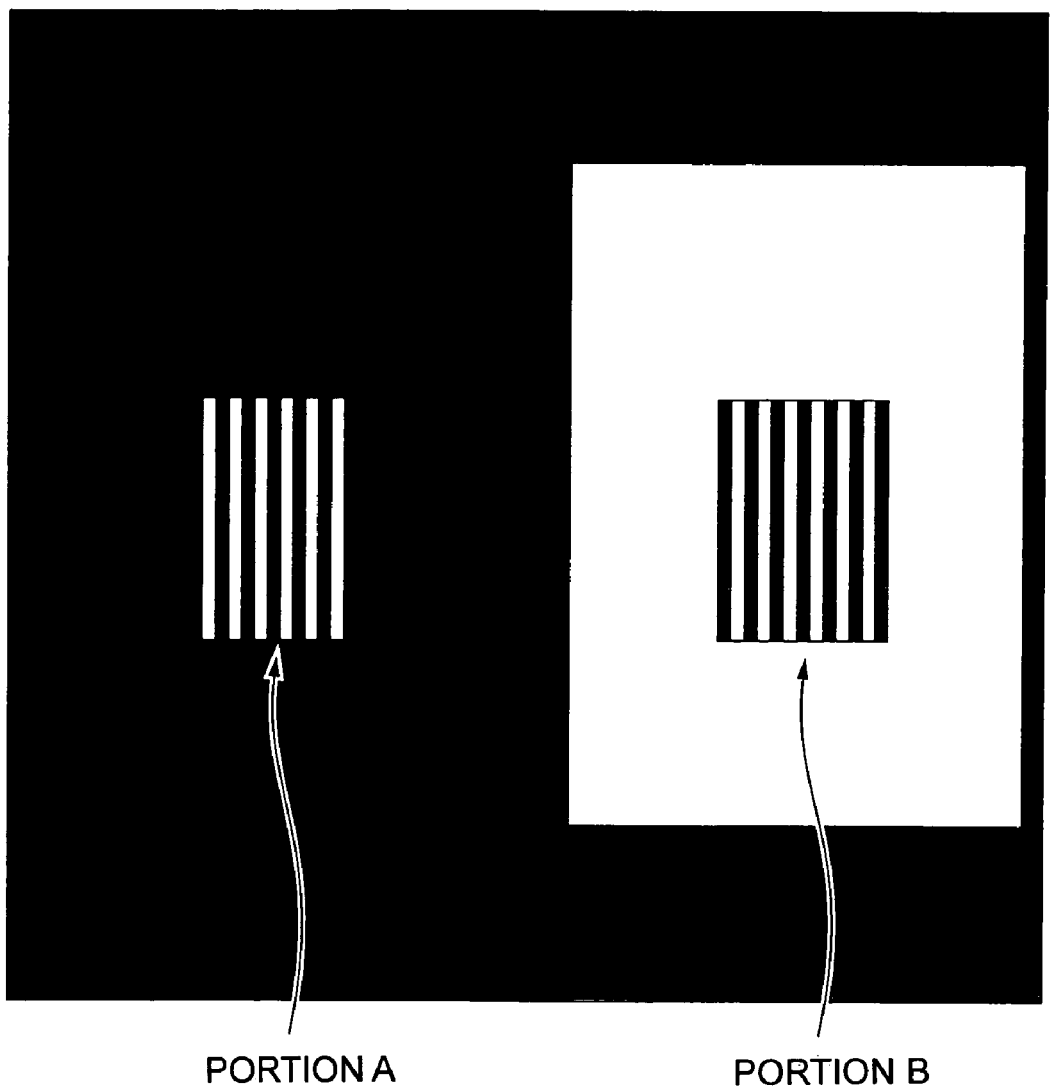
FIG. 2 is an exemplary diagram of a resist pattern formed in the embodiments.

Then, the resist 4 was subjected to electron-beam drawing by the use of JBX9000 produced by JEOL Ltd. and was then developed to thereby form a resist pattern 41 (0.4 μm line and space) as shown in FIG. 2 (see FIG. 1(d)).

The formed resist pattern 41 has in the plane thereof a portion A and a portion B formed by the same pattern. In a region with a prescribed area including the portion A, the resist around the portion A is not removed but remains on the surface, while, in a region (white portion in the figure) with the same prescribed area including the portion B, the resist around the portion B is removed so that the inorganic-based etching mask film 3 appears on the surface. That is, by comparing patterns at the portions A and B, it is possible to evaluate a CD characteristic obtained when pattern regions having a global opening ratio difference are compositely present in the plane of a mask.

Then, dimensions of the obtained resist pattern 41 were measured at the portions A and B, respectively, by the use of CD-SEM (EMU-220) produced by Holon Inc.

Then, using the resist pattern 41 as a mask, dry etching mainly with ionicity was carried out under a pressure of 5 [mm Torr] by the use of a mixture gas of SF$_6$ and He to etch the inorganic-based etching mask film 3 to thereby form an inorganic-based etching mask pattern 31 (see FIG. 1(e)).

Then, using the resist pattern 41 and the inorganic-based etching mask pattern 31 as masks, dry etching mainly with radicals where ionicity was increased as much as possible (=ionicity was increased to a level where ions and radicals became approximately equal to each other) was carried out under a pressure of 3 mm Torr by the use of a mixture gas of Cl$_2$ and O$_2$ to etch the opaque chromium film 2 to thereby form an opaque chromium pattern 21 (see FIG. 1(f)).

Then, the resist pattern 41 and the inorganic-based etching mask pattern 31 were stripped, and thereafter, prescribed washing was carried out to obtain a photomask 10 (see FIG. 1(g)).

Then, like the resist pattern 41, dimensions of the obtained opaque chromium pattern 21 were measured at the portions A and B, respectively, by the use of CD-SEM. As a result, a difference between size conversion differences (size differences each between the resist pattern 41 and the opaque chromium pattern 21) in the portions A and B was surprisingly 5 nm so that it was possible to produce the photomask 10 with an extremely excellent CD characteristic.

Second Embodiment

Referring to FIG. 1, description will be made of a photomask producing method according to the second embodiment of this invention. In the second embodiment, a photomask was produced under the same condition as in the first embodiment except that the opaque chromium film 2 was etched using only the inorganic-based etching mask pattern 31 as a mask after removal of the resist pattern 41 in the first embodiment.

Specifically, first, a substrate made of quartz was mirror-polished and was subjected to prescribed washing to thereby obtain a light-transmissive substrate 1 of 6 inches×6 inches× 0.25 inches.

Then, by the use of an in-line sputtering apparatus where a plurality of chromium (Cr) targets were disposed in the same chamber, an opaque chromium film 2 was formed on the light-transmissive substrate 1 (see FIG. 1(a)).

Specifically, first, reactive sputtering was carried out in an atmosphere of mixture gas of argon (Ar) and nitrogen (N$_2$) (Ar:N$_2$=72:28 [volume %], pressure 0.3 [Pa]) to thereby form a CrN film having a thickness of 20 [nm].

Subsequently, reactive sputtering was carried out in an atmosphere of mixture gas of argon (Ar) and methane (CH$_4$) (Ar:CH$_4$=96.5:3.5 [volume %], pressure 0.3 [Pa]) to thereby form a CrC film having a thickness of 37 [nm] on the CrN film.

Subsequently, reactive sputtering was carried out in an atmosphere of mixture gas of argon (Ar) and nitrogen monoxide (NO) (Ar:NO=87.5:12.5 [volume %], pressure 0.3 [Pa]) to thereby form a CrON film having a thickness of 15 [nm] on the CrN film.

The foregoing CrN film, CrC film, and CrON film were successively formed by the use of the in-line sputtering apparatus so that the opaque chromium film 2 containing these CrN, CrC, and CrON was configured such that these components continuously changed in a thickness direction thereof.

Then, by the use of a mixture target of molybdenum (Mo) and silicon (Si) (Mo:Si=20:80 [mol %]), reactive sputtering was carried out in an atmosphere of mixture gas of argon (Ar) and nitrogen (N$_2$) (Ar:N$_2$=10:90 [volume %], pressure 0.3 [Pa]) to thereby form an MoSiN-based inorganic-based etching mask film 3 having a thickness of 92 [nm] on the opaque chromium film 2 (see FIG. 1(b)).

Then, a positive electron beam resist 4 (ZEP7000: produced by Zeon Corporation) was applied on the inorganic-based etching mask film 3 to have a thickness of 400 [nm] by the spin coat method (see FIG. 1(c)).

By the foregoing, preparation was made of a photomask blank 11 in which the opaque chromium film 2, the MoSiN-based inorganic-based etching mask film 3, and the resist 4 were formed in order on the light-transmissive substrate 1.

Then, the resist 4 was subjected to electron-beam drawing by the use of JBX9000 produced by JEOL Ltd. and was then developed to thereby form a resist pattern 41 (0.4 μm line and space) as shown in FIG. 2 (see FIG. 1(d)).

The formed resist pattern 41 has in the plane thereof a portion A and a portion B formed by the same pattern. In a region with a prescribed area including the portion A, the resist around the portion A is not removed but remains on the surface, while, in a region (white portion in the figure) with the same prescribed area including the portion B, the resist around the portion B is removed so that the inorganic-based etching mask film 3 appears on the surface. That is, by comparing patterns at the portions A and B, it is possible to evaluate a CD characteristic obtained when pattern regions having a global opening ratio difference are compositely present in the plane of a mask.

Then, dimensions of the obtained resist pattern 41 were measured at the portions A and B, respectively, by the use of CD-SEM (EMU-220) produced by Holon Inc.

Then, using the resist pattern 41 as a mask, dry etching mainly with ionicity was carried out under a pressure of 5 [mm Torr] by the use of a mixture gas of $SF_6$ and He to etch the inorganic-based etching mask film 3 to thereby form an inorganic-based etching mask pattern 31 (see FIG. 1(e)).

Then, the resist pattern 41 was removed. Thereafter, using only the inorganic-based etching mask pattern 31 as a mask, dry etching mainly with radicals where ionicity was increased as much as possible (=ionicity was increased to a level where ions and radicals became approximately equal to each other) was carried out under a pressure of 3 mm Torr by the use of a mixture gas of $Cl_2$ and $O_2$ to etch the opaque chromium film 2 to thereby form an opaque chromium pattern 21 (see FIG. 1(f)).

Then, the inorganic-based etching mask pattern 31 was stripped, and thereafter, prescribed washing was carried out to obtain a photomask 10 (see FIG. 1(g)).

Then, like the resist pattern 41, dimensions of the obtained opaque chromium pattern 21 were measured at the portions A and B, respectively, by the use of CD-SEM. As a result, a difference between size conversion differences (size differences each between the resist pattern 41 and the opaque chromium pattern 21) in the portions A and B was quite surprisingly 1 nm so that it was possible to produce the photomask 10 with an extremely excellent CD characteristic.

FIRST COMPARATIVE EXAMPLE

The first comparative example is a method that produces a photomask without forming the inorganic-based etching mask film 3 in the photomask producing method according to the first embodiment.

First, a substrate made of quartz was mirror-polished and was subjected to prescribed washing to thereby obtain a light-transmissive substrate 1 of 6 inches×6 inches×0.25 inches.

Then, according to the same method as in the first embodiment, an opaque chromium film 2 comprised of a CrN film, a CrC film, and a CrON film was formed on the light-transmissive substrate 1 by the use of an in-line sputtering apparatus where a plurality of chromium (Cr) targets were disposed in the same chamber.

Then, a resist 4 was applied on the opaque chromium film 2 to a thickness of 400 [nm] by the spin coat method like in the first embodiment.

Then, the resist 4 was subjected to electron-beam drawing like in the first embodiment and was then developed to thereby form a resist pattern 41 (0.4 µm line and space) as shown in FIG. 2 like in the first embodiment. Then, dimensions of the obtained resist pattern 41 were measured at portions A and B, respectively, by the use of CD-SEM.

Then, using the resist pattern 41 as a mask, conventional dry etching with low ionicity was carried out under a pressure of 8 mm torr by the use of a mixture gas of $Cl_2$ and $O_2$ to etch the opaque chromium film 2 to thereby form an opaque chromium pattern 21.

Then, like in the first embodiment, the resist pattern 41 was stripped, and thereafter, prescribed washing was carried out to obtain a photomask 10.

Then, like the resist pattern 41, dimensions of the obtained opaque chromium pattern 21 were measured at the portions A and B, respectively, by the use of CD-SEM. As a result, a difference between size conversion differences (size differences each between the resist pattern 41 and the opaque chromium pattern 21) in the portions A and B was 30 nm. Therefore, the CD characteristic was extremely inferior as compared to the first embodiment wherein the photomask was produced by forming the inorganic-based etching mask film 3.

In the second embodiment of this invention, as compared to the first comparative example (conventional example), the loading effect could be remarkably suppressed and the photomask 10 could be produced with the extremely excellent CD characteristic of 1 nm which was not imaginable conventionally.

Third Embodiment

Figure 3:
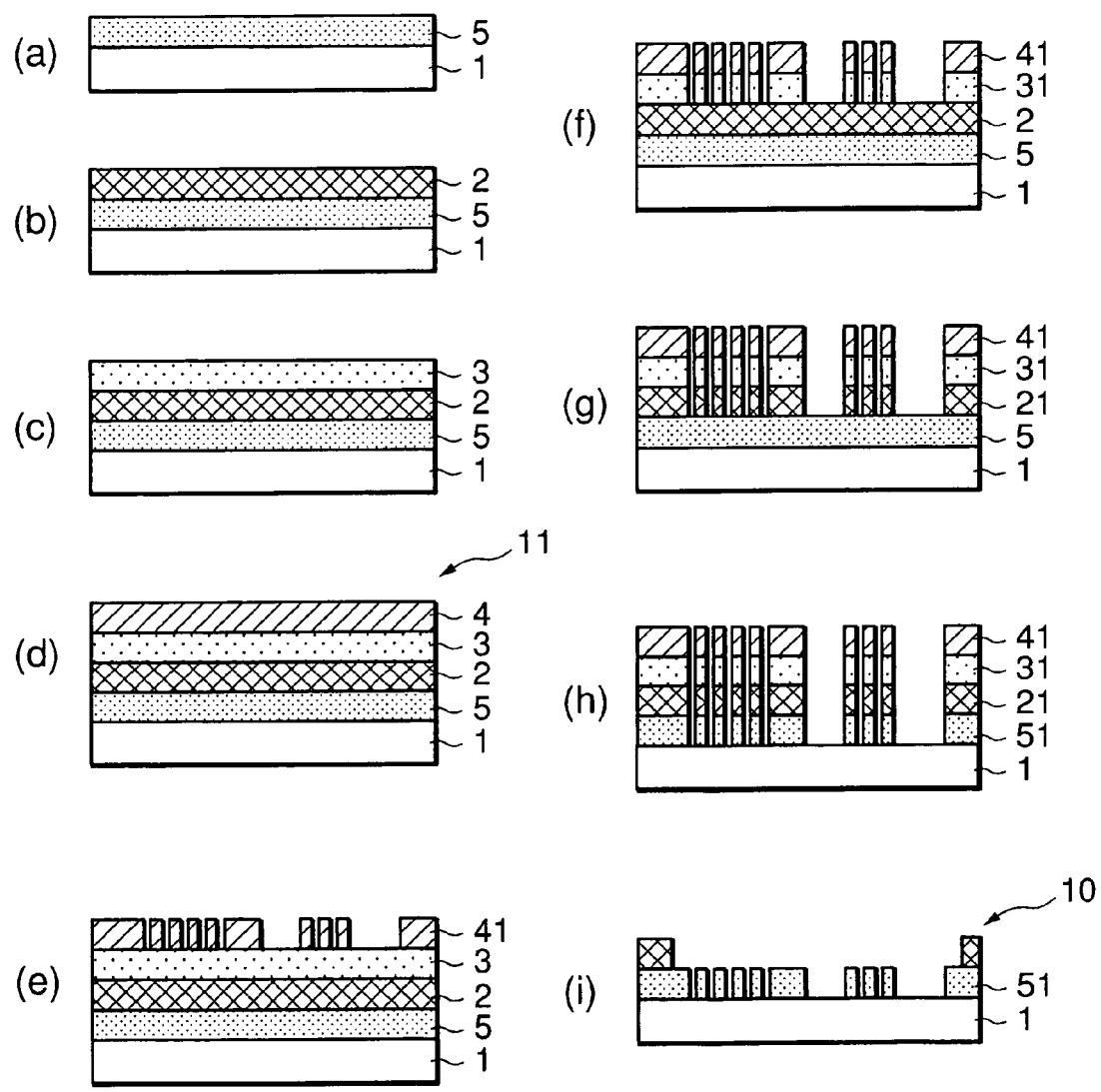
FIG. 3 is a diagram for describing photomask producing methods according to third and fourth embodiments of this invention.

Referring to FIG. 3, description will be made of a photomask producing method according to the third embodiment of this invention.

First, a substrate made of quartz was mirror-polished and was subjected to prescribed washing to thereby obtain a light-transmissive substrate 1 of 6 inches×6 inches×0.25 inches.

Then, by the use of a mixture target of molybdenum (Mo) and silicon (Si) (Mo:Si=20:80 [mol %]), reactive sputtering was carried out in an atmosphere of mixture gas of argon (Ar) and nitrogen ($N_2$) (Ar:$N_2$=10:90 [volume %], pressure 0.3 [Pa]) to thereby form an MoSiN-based light-semitransmissive phase shift film 5 having a thickness of 100 [nm] on the light-transmissive substrate 1 (FIG. 3(a)).

Then, by the use of an in-line sputtering apparatus where a plurality of chromium (Cr) targets were disposed in the same chamber, an opaque chromium film 2 comprised of a CrN film, a CrC film, and a CrON film was formed on the phase shift film 5 according to the same method as in the first embodiment (FIG. 3(b)).

Then, an MoSiN-based inorganic-based etching mask film 3 having a thickness of 92 [nm] was formed on the opaque chromium film 2 according to the same method as in the first embodiment (FIG. 3(c)).

Then, a resist 4 was applied on the inorganic-based etching mask film 3 to a thickness of 400 [nm] by the spin coat method like in the first embodiment (FIG. 3(d)).

By the foregoing, preparation was made of a mask blank 11 of a halftone phase shift type (halftone phase shift mask blank) in which the light-semitransmissive phase shift film 5 made of an MoSiN-based material, the opaque chromium film 2 made of a Cr-based material, the inorganic-based etching mask film 3 made of an MoSiN-based material, and the resist 4 were formed in order on the light-transmissive substrate 1 (FIG. 3(d)).

Then, like in the first embodiment, the resist 4 was subjected to electron-beam drawing and was then developed to thereby form a resist pattern 41 (0.4 µm line and space) as shown in FIG. 2, and dimensions of the obtained resist pattern 41 were measured at the portions A and B, respectively, by the use of CD-SEM (FIG. 3(e)).

Then, according to the same method as in the first embodiment, dry etching of the inorganic-based etching mask film 3 was carried out using the resist pattern 41 as a mask to thereby form an inorganic-based etching mask pattern 31 (FIG. 3(f)).

Then, according to the same method as in the first embodiment, dry etching of the opaque chromium film 2 was carried out using the resist pattern 41 and the inorganic-based etching mask pattern 31 as masks to thereby form an opaque chromium pattern 21 (FIG. 3(g)).

Then, using the resist pattern 41, the inorganic-based etching mask pattern 31, and the opaque chromium pattern 21 as masks, dry etching of the phase shift film 5 was carried out under a pressure of 5 mm Torr by the use of a mixture gas of $SF_6$ and He to thereby form a phase shift pattern 51 (FIG. 3(h)). In this event, the MoSiN-based inorganic-based etching mask pattern 31 is etched at its portions where the resist is retreated due to the dry etching of the phase shift film 5. However, until completely etched, the inorganic-based etching mask pattern protects the opaque chromium pattern from the dry etching of the phase shift film 5, and therefore, generation of dust caused by damage of the opaque chromium pattern due to the dry etching of the phase shift film 5 can be reduced to a level that causes no influence.

Then, the resist pattern 41 and the inorganic-based etching mask pattern 31 were stripped, and then the opaque chromium pattern 21 around a transfer pattern region was stripped (the opaque chromium pattern may be left at its portions that are located in the transfer pattern region and that are better to remain in terms of an exposure process which uses the photomask). Thereafter, prescribed washing was carried out to obtain a photomask 10 of a halftone phase shift type (halftone phase shift mask) (FIG. 3(i)).

Then, like the resist pattern 41, dimensions of the obtained phase shift pattern 51 were measured at the portions A and B, respectively, by the use of CD-SEM. As a result, a difference between size conversion differences (size differences each between the resist pattern 41 and the phase shift pattern 51) in the portions A and B was surprisingly 4 nm so that it was possible to produce the halftone phase shift mask with an extremely excellent CD characteristic.

Fourth Embodiment

Referring to FIG. 3, description will be made of a photomask producing method according to the fourth embodiment of this invention. In the fourth embodiment, a photomask was produced under the same condition as in the third embodiment except that the opaque chromium film 2 was etched using only the inorganic-based etching mask pattern 31 as a mask after removal of the resist pattern 41 in the third embodiment.

Specifically, first, a substrate made of quartz was mirror-polished and was subjected to prescribed washing to thereby obtain a light-transmissive substrate 1 of 6 inches×6 inches× 0.25 inches.

Then, by the use of a mixture target of molybdenum (Mo) and silicon (Si) (Mo:Si=20:80 [mol %]), reactive sputtering was carried out in an atmosphere of mixture gas of argon (Ar) and nitrogen ($N_2$) (Ar:$N_2$=10:90 [volume %], pressure 0.3 [Pa]) to thereby form an MoSiN-based light-semitransmissive phase shift film 5 having a thickness of 100 [nm] on the light-transmissive substrate 1 (FIG. 3(a)).

Then, by the use of an in-line sputtering apparatus where a plurality of chromium (Cr) targets were disposed in the same chamber, an opaque chromium film 2 comprised of a CrN film, a CrC film, and a CrON film was formed on the phase shift film 5 according to the same method as in the first embodiment (FIG. 3(b)).

Then, an MoSiN-based inorganic-based etching mask film 3 having a thickness of 92 [nm] was formed on the opaque chromium film 2 according to the same method as in the first embodiment (FIG. 3(c)).

Then, a resist 4 was applied on the inorganic-based etching mask film 3 to a thickness of 400 [nm] by the spin coat method like in the first embodiment (FIG. 3(d)).

By the foregoing, preparation was made of a mask blank 11 of a halftone phase shift type (halftone phase shift mask blank) in which the light-semitransmissive phase shift film 5 made of an MoSiN-based material, the opaque chromium film 2 made of a Cr-based material, the inorganic-based etching mask film 3 made of an MoSiN-based material, and the resist 4 were formed in order on the light-transmissive substrate 1 (FIG. 3(d)).

Then, like in the first embodiment, the resist 4 was subjected to electron-beam drawing and was then developed to thereby form a resist pattern 41 (0.4 μm line and space) as shown in FIG. 2, and dimensions of the obtained resist pattern 41 were measured at the portions A and B, respectively, by the use of CD-SEM (FIG. 3(e)).

Then, according to the same method as in the first embodiment, dry etching of the inorganic-based etching mask film 3 was carried out using the resist pattern 41 as a mask to thereby form an inorganic-based etching mask pattern 31 (FIG. 3(f)).

Then, according to the same method as in the second embodiment, after removal of the resist pattern 41, dry etching of the opaque chromium film 2 was carried out using only the inorganic-based etching mask pattern 31 as a mask to thereby form an opaque chromium pattern 21 (FIG. 3(g)).

Then, using the resist pattern 41, the inorganic-based etching mask pattern 31, and the opaque chromium pattern 21 as masks, dry etching of the phase shift film 5 was carried out under a pressure of 5 mm Torr by the use of a mixture gas of $SF_6$ and He to thereby form a phase shift pattern 51 (FIG. 3(h)).

Then, using the resist pattern 41, the inorganic-based etching mask pattern 31, and the opaque chromium pattern 21 as masks, dry etching of the phase shift film 5 was carried out under a pressure of 5 mm Torr by the use of a mixture gas of $SF_6$ and He to thereby form a phase shift pattern 51 (FIG. 3(h)). In this event, the MoSiN-based inorganic-based etching mask pattern 31 is etched due to the dry etching of the phase shift film 5. However, until completely etched, the inorganic-based etching mask pattern protects the opaque chromium pattern from the dry etching of the phase shift film 5, and therefore, generation of dust caused by damage of the opaque chromium pattern due to the dry etching of the phase shift film 5 can be reduced to a level that causes no influence.

Then, the resist pattern 41 and the inorganic-based etching mask pattern 31 were stripped, and then the opaque chromium pattern 21 around a transfer pattern region was stripped (the opaque chromium pattern may be left at its portions that are located in the transfer pattern region and that are better to remain in terms of an exposure process which uses the photomask). Thereafter, prescribed washing was carried out to obtain a photomask 10 of a halftone phase shift type (halftone phase shift mask) (FIG. 3(i)).

Then, like the resist pattern 41, dimensions of the obtained phase shift pattern 51 were measured at the portions A and B, respectively, by the use of CD-SEM. As a result, a difference between size conversion differences (size differences each between the resist pattern 41 and the phase shift pattern 51) in the portions A and B was quite surprisingly 2 nm so that it was possible to produce the halftone phase shift mask with an extremely excellent CD characteristic.

SECOND COMPARATIVE EXAMPLE

The second comparative example is a method that produces a photomask without forming the inorganic-based etching mask film 3 in the photomask producing method according to the third embodiment.

First, a substrate made of quartz was mirror-polished and was subjected to prescribed washing to thereby obtain a light-transmissive substrate 1 of 6 inches×6 inches×0.25 inches.

Then, like in the second embodiment, an MoSiN-based light-semitransmissive phase shift film 5 having a thickness of 100 [nm] was formed on the light-transmissive substrate 1.

Then, according to the same method as in the second embodiment, an opaque chromium film 2 comprised of a CrN film, a CrC film, and a CrON film was formed on the phase shift film 5 by the use of an in-line sputtering apparatus where a plurality of chromium (Cr) targets were disposed in the same chamber.

Then, a resist 4 was applied on the opaque chromium film 3 to a thickness of 400 [nm] by the spin coat method like in the second embodiment.

Then, like in the second embodiment, the resist 4 was subjected to electron-beam drawing and was then developed to thereby form a resist pattern 41 (0.4 µm line and space) as shown in FIG. 2, and dimensions of the obtained resist pattern 41 were measured at portions A and B, respectively, by the use of CD-SEM.

Then, according to the same method as in the first comparative example, dry etching of the opaque chromium film 2 was carried out using the resist pattern 41 as a mask to thereby form an opaque chromium pattern 21.

Then, using the resist pattern 41 and the opaque chromium pattern 21 as masks, dry etching was carried out like in the second embodiment to thereby form a phase shift pattern 51.

Then, the resist pattern 41 was stripped, and subsequently, the opaque chromium pattern 21 around a transfer pattern region was stripped. Thereafter, prescribed washing was carried out to obtain a photomask 10 of a halftone phase shift type.

Then, like the resist pattern 41, dimensions of the obtained phase shift pattern 51 were measured at the portions A and B, respectively, by the use of CD-SEM. As a result, a difference between size conversion differences in the portions A and B was 35 nm. Therefore, the CD characteristic was extremely inferior as compared to the second embodiment wherein the photomask was produced by forming the inorganic-based etching mask film 3.

Fifth Embodiment

Now, description will be made of a chromeless-type phase shift mask producing method according to the fifth embodiment of this invention.

The fifth embodiment is an example wherein a chromeless-type phase shift mask was produced by further etching the substrate using the opaque chromium film pattern as a mask from the state before the stripping of the inorganic-based etching mask in the second embodiment.

First, a photomask before stripping of an inorganic-based etching mask was produced according to the same method as in the second embodiment.

Then, using as a mask an opaque chromium pattern 21 with an inorganic-based etching mask pattern 31 in the photomask 10, a substrate was etched to a thickness of 180 nm where the phase difference became about 180°. This etching was carried out under a pressure of 0.3 Pa using a mixture gas of $Cl_2$, $O_2$, and He as a dry etching gas. In this event, the MoSiN-based inorganic-based etching mask pattern 31 is etched due to the dry etching of the substrate. However, until completely etched, the inorganic-based etching mask-pattern protects the opaque chromium pattern from the dry etching of the substrate, and therefore, generation of dust caused by damage of the opaque chromium pattern due to the dry etching of the substrate can be reduced to a level that causes no influence.

Then, the opaque chromium pattern was stripped such that an opaque chromium film at least around a transfer region was left (the opaque chromium pattern may be left at its portions that are located in the transfer pattern region and that are better to remain in terms of an exposure process which uses the photomask). Thereafter, prescribed washing was carried out to obtain a chromeless-type phase shift mask.

According to the obtained chromeless-type phase shift mask, the CD characteristic of the opaque chromium pattern 21 of the photomask 10 is transferred so that it is possible to produce the chromeless-type phase shift mask having an extremely excellent CD characteristic.

Further, according to this embodiment, the inorganic-based etching mask is simultaneously etched in the etching of the substrate, and therefore, the process of stripping the inorganic-based etching mask is not required.

In this embodiment, if a material and a thickness of the inorganic-based etching mask pattern are selected such that the etching of the substrate and the etching of the inorganic-based etching mask pattern are finished in the same etching time, it is preferable in that it becomes possible to detect the termination point of the etching of the substrate by detecting the termination point of the etching of the inorganic-based etching mask pattern.

THIRD COMPARATIVE EXAMPLE

The third comparative example is an example wherein a chromeless-type phase shift mask was produced by further etching the substrate using the opaque chromium film pattern as a mask from the state before the stripping of the inorganic-based etching mask in the first comparative example.

First, a photomask before stripping of an inorganic-based etching mask was produced according to the same method as in the second comparative example.

Then, using as a mask an opaque chromium pattern 21 in this photomask, a substrate was etched to a thickness of 180 nm where the phase difference became about 180°. This etching was carried out under a pressure of 0.68 Pa using a mixture gas of $CF_4$ and $O_2$ as a dry etching gas. In this event, it was confirmed that surfaces of etched portions of the substrate were roughened under the influence of generation of dust caused by damage of the opaque chromium pattern due to the dry etching of the substrate.

Then, the opaque chromium pattern was stripped such that an opaque chromium film at least around a transfer region was left (the opaque chromium pattern may be left at its portions that are located in the transfer pattern region and that are better to remain in terms of an exposure process which uses the photomask). Thereafter, prescribed washing was carried out to obtain a chromeless-type phase shift mask.

According to the obtained chromeless-type phase shift mask, the CD characteristic was extremely inferior as compared to the fifth embodiment.

In the first to fifth embodiments of this invention, use is made of the mixture gas of $SF_6$ and He in the dry etching mainly with ions. However, by setting a proper dry etching condition, a similar effect can be achieved using a gas such as $CF_4$, $C_2F_6$, or $CHF_3$, or a mixture gas thereof with He, $H_2$, $N_2$, Ar, $C_2H_4$, or $O_2$.

Further, in the first to fifth embodiments of this invention, use is made of the MoSiN-based material for the inorganic-based etching mask film. However, a similar effect can be achieved using Mo alone, MoSi, MoSiO, MoSiN, MoSiON, Si alone, SiO, SiN, SiON, Ta alone, TaB, W, WSi, or TaSi.

Further, in the first to fifth embodiments of this invention, use is made of the mixture gas of $Cl_2$ and $O_2$ in the dry etching mainly with radicals. However, by setting a proper dry etching condition, a similar effect can be achieved using a mixture gas of $CH_2Cl_2$ and $O_2$, or a mixture gas thereof with He, $H_2$, $N_2$, Ar, or $C_2H_4$.

As described above, according to this invention, it is possible to suppress the loading effect and to achieve a high CD accuracy when forming a highly accurate pattern by dry etching, in a photomask having a global opening ratio difference (variation in CD accuracy due to the loading effect becomes a problem).

It is possible to form a pattern having a high CD accuracy regardless of the foregoing regions (over the whole surface of the mask) having a global opening ratio difference (variation in CD accuracy due to the loading effect becomes a problem) in the mask plane.

Further, this invention can suppress the loading effect and achieve a high CD accuracy in etching an opaque chromium film as an etching mask film when producing a halftone-type phase shift mask or a chromeless-type phase shift mask comprising a phase shift layer having a global opening ratio difference (variation in CD accuracy due to the loading effect becomes a problem).

What is claimed is:

1. A method of producing a photomask in which a light-transmissive substrate is formed thereon with a chromium pattern having a global opening ratio difference in its plane on the light-transmissive substrate, said method characterized by comprising the steps of:

preparing a photomask blank having, on said light-transmissive substrate, at least a chromium film for forming said chromium pattern, an etching mask film made of an inorganic-based material having a resistance against etching of said chromium film, and a resist film;

exposing and developing said resist film with a desired pattern to form a resist pattern;

applying dry etching to said etching mask film using said resist pattern as a mask to form an etching mask pattern; and applying dry etching to said chromium film using said etching mask pattern as a mask to form said chromium pattern, wherein the dry etching of said chromium film is carried out under a condition selected from conditions that cause damage to said resist pattern to a degree which is unallowable when etching said chromium film using said resist pattern as a mask, wherein, in the step of forming said chromium pattern, an etching rate of said chromium film is ten or more times an etching rate of said etching mask pattern, and selection ratio of etching rate of inorganic-based etching mask pattern material/etching rate of resist is two or more.

2. A method of producing a photomask according to claim 1, characterized in that the condition that causes damage to said resist pattern which is unallowable when etching said chromium film using said resist pattern as a mask is a condition that increases anisotropy of dry etching and/or a condition that increases an etchant density of etching.

3. A method of producing a photomask according to claim 1, characterized in that said photomask is a binary mask having said chromium pattern on said light-transmissive substrate.

4. A method of producing a photomask according to claim 1, characterized by further comprising a step of stripping said etching mask pattern after forming said chromium pattern.

5. A method of producing a photomask according to claim 1, characterized in that said etching mask pattern is left on said chromium pattern as a film having a reflection preventing function.

6. A method of producing a photomask according to claim 1, characterized in that said photomask is a phase shift mask and said photomask blank has a phase shift film between said light-transmissive substrate and said chromium film, and characterized by further comprising a step of forming a phase shift pattern using said chromium pattern as a mask after the step of forming said chromium pattern.

7. A method of producing a photomask according to claim 1, characterized in that said photomask is a phase shift mask and characterized by further comprising a step of patterning said light-transmissive substrate to form a phase shift groove using said chromium pattern as a mask after the step of forming said chromium pattern.

8. A method of producing a photomask according to claim 1, characterized by comprising a step of stripping, before the step of forming said chromium pattern, said resist pattern remaining in the step of forming said etching mask pattern.

9. A method of producing a photomask according to claim 1, characterized in that said etching mask film made of the inorganic-based material is made of a material containing at least one of molybdenum, silicon, tantalum, and tungsten.

10. A photomask producing method of producing a halftone-type phase shift mask in which a light-transmissive substrate is formed thereon with a light-semitransmissive phase shift pattern having a global opening ratio difference in its plane on the light-transmissive substrate, said method characterized by comprising the steps of:

preparing a photomask blank having, on said light-tranamissive substrate, at least a light-semitransmissive phase shift film for forming said light-semitransmissive phase shift pattern, a chromium film for forming a chromium pattern, an etching mask film made of an inorganic-based material having a resistance against etching of said chromium film, and a resist film;

exposing and developing said resist film with a desired pattern to form a resist pattern;

applying dry etching to said etching mask film using said resist pattern as a mask to form an etching mask pattern;

applying dry etching to said chromium film using said etching mask pattern as a mask to form said chromium pattern;

applying dry etching to said light-semitransmissive phase shift film using said chromium pattern as a mask to form said light-semitransmissive phase shift pattern; and removing a desired part or the whole of said chromium pattern, wherein, in the step of forming said chromium pattern, an etching rate of said chromium film is ten or more times an etching rate of said etching mask pattern and selection ratio of etching rate of inorganic-based etching mask pattern material/etching rate of resist is two or more.

11. A photomask producing method according to claim 10, characterized in that said etching mask pattern is stripped with the dry etching of said light-semitransmissive phase shift film.

12. A photomask producing method according to claim 10, characterized in that said etching mask pattern is left on said chromium pattern as a film having a reflection preventing function.

13. A photomask producing method according to claim 10, characterized in that said light-semitransmissive phase shift film comprises an uppermost layer made of a material containing silicon, and nitrogen and/or oxygen.

14. A photomask producing method according to claim 13, characterized in that said light-semitransmissive phase shift film is a film of a monolayer structure made of a material containing metal, silicon, and nitrogen and/or oxygen.

15. A photomask producing method according to claim 10, characterized by comprising a step of stripping, before the step of forming said chromium pattern, said resist pattern remaining in the step of forming said etching mask pattern.

16. A photomask producing method according to claim 10, characterized in that said etching mask film made of the inorganic-based material is made of a material containing at least one of molybdenum, silicon, tantalum, and tungsten.

17. A photomask producing method of producing a chromeless-type phase shift mask in which a light-transmissive substrate is formed thereon with a light-transmissive phase shift pattern having a global opening ratio difference in its plane on the light-transmissive substrate, said method characterized by comprising the steps of:

preparing a photomask blank having, on said light-transmissive substrate, at least a chromium film for forming a chromium pattern, an etching mask film made of an inorganic-based material having a resistance against etching of said chromium film, and a resist film;

exposing and developing said resist film with a desired pattern to form a resist pattern;

applying dry etching to said etching mask film using said resist pattern as a mask to form an etching mask pattern;

applying dry etching to said chromium film using said etching mask pattern as a mask to form said chromium pattern;

applying dry etching to said light-transmissive substrate using said chromium pattern as a mask to form said light-transmissive phase shift pattern; and removing a desired part or the whole of said chromium pattern, wherein, in the step of forming said chromium pattern, an etching rate of said chromium film is ten or more times an etching rate of said etching mask pattern and selection ratio of etching rate of inorganic-based etching mask pattern material/etching rate of resist is two or more.

18. A photomask producing method according to claim 17, characterized in that said etching mask pattern is stripped with the dry etching of said light-transmissive substrate.

19. A photomask producing method according to claim 17, characterized in that said etching mask pattern is left on said chromium pattern as a film having a reflection preventing function.

20. A photomask producing method according to claim 17, characterized by comprising a step of stripping, before the step of forming said chromium pattern, said resist pattern remaining in the step of forming said etching mask pattern.

21. A photomask producing method according to claim 17, characterized in that said etching mask film made of the inorganic-based material is made of a material containing at least one of molybdenum, silicon, tantalum, and tungsten.

* * * * *